United States Patent
Hsu et al.

(10) Patent No.: US 6,861,898 B2
(45) Date of Patent: Mar. 1, 2005

(54) LOOP FILTER AND METHOD FOR ADJUSTING A COMPENSATING CURRENT OF THE SAME

(75) Inventors: Tse-Hsiang Hsu, Hsinchu (TW); Chih-Cheng Chen, Hsin Chu (TW)

(73) Assignee: Mediatek Inc., Hsin Chu (TW)

( * ) Notice: Subject to any disclaimer, the term of this patent is extended or adjusted under 35 U.S.C. 154(b) by 0 days.

(21) Appl. No.: 10/668,218

(22) Filed: Sep. 24, 2003

(65) Prior Publication Data

US 2004/0061551 A1 Apr. 1, 2004

(30) Foreign Application Priority Data

Sep. 30, 2002 (TW) ........................................ 91122588 A

(51) Int. Cl.$^7$ ................................................ H03K 5/00
(52) U.S. Cl. ........................ 327/552; 327/551; 327/311
(58) Field of Search ........................ 327/551, 552, 327/555, 556, 557, 558, 559, 311

(56) References Cited

U.S. PATENT DOCUMENTS 4,868,645 A * 9/1989 Kobayashi .................. 348/69
4,977,375 A * 12/1990 Toth ........................ 324/511

* cited by examiner

Primary Examiner—Timothy P. Callahan
Assistant Examiner—An T. Luu
(74) Attorney, Agent, or Firm—Birch, Stewart, Kolasch & Birch, LLP.

(57) ABSTRACT

A loop filter and a method for adjusting its compensating current to make a control voltage of the loop filter more stable. The loop filter includes a charge/discharge path for receiving a control current and constituted by a first resister and a capacitor, a second resistor connected to the first terminal of the first resistor, an OP amplifier having an output terminal connected to the second resistor, a first input terminal connected to the capacitor, and a second input terminal, and a compensating unit connected to the output and second terminals of the second resistor. The loop filter further comprises a current source to provide a compensating current to the compensating unit. The loop filter utilizes the compensating unit to compensate the offset between the two input terminals of the amplifier. Therefore, the loop current of the OP amplifier can be reduced or eliminated.

9 Claims, 6 Drawing Sheets

LOOP FILTER AND METHOD FOR ADJUSTING A COMPENSATING CURRENT OF THE SAME

This nonprovisional application claims priority under 35 U.S.C. § 119(a) on Patent Application No(s). 091122588 filed in TAIWAN, R.O.C. on Sep. 30, 2002, which is (are) herein incorporated by reference.

BACKGROUND OF THE INVENTION

1. Field of the Invention

The invention relates to a loop filter, and more particular to a loop filter capable of reducing an undesired loop current generated by offset voltage of OP amplifier in the loop filter so as to reduce the ripple of the control voltage of voltage controlled oscillator (VCO) by adjusting a compensating current of the OP amplifier in the loop filter.

2. Description of the Related Art

A phase locked loop (hereinafter referred to as PLL) is employed to generate an oscillated clock having the same phase with a reference clock. As shown in FIG. 1, a typical PLL includes a phase detector 11, a charge pump 12, a loop filter 13, a voltage control oscillator (hereinafter referred to as VCO) 14, and a frequency divider 15. The phase detector 11 detects the phase difference between an input signal IN and a phase-locked clock PLCK2, and outputs control pulses UP and DN to control the charge pump 12 according to the phase difference. Foe example, when the phase of the phase-locked clock PLCK2 leads the phase of the input signal IN, the width of the control pulse UP is smaller than the width of the control pulse DN, so that the charge pump 12 generates a negative control current Icp. The loop filter 13 reduces the control voltage Vctl according to the negative control current Icp, and thus the VCO 14 reduces the frequency of the phase-locked clock PLCK1. On the contrary, when the phase of the phase-locked clock PLCK2 lags behind the phase of the input signal IN, the width of the control pulse UP is greater than the width of the control pulse DN, so that the charge pump 12 generates a positive control current Icp. The loop filter 13 increases the control voltage Vctl according to the negative control current Icp, and thus the VCO 14 increases the frequency of the phase-locked clock PLCK1.

FIG. 2 is a circuit of a conventional loop filter. Referring to FIG. 2, the loop filter 20 includes a charge/discharge path constituted by a resistor R1 and a capacitor C1. The control current Icp charges/discharges the capacitor C1 through the resistor R1 to enable the loop filter 20 to generate the control voltage Vctl. As shown in the drawing, the control voltage Vctl is the summation of the voltage on the resistor R1 and the voltage on the capacitor C1. However, if the desired loop bandwidth of PLL is small, the capacitor in loop filter 20 becomes extremely large as to generate a proper control voltage Vctl. However, a larger capacitor may occupy larger area, and the chip cannot be miniaturized accordingly.

FIG. 3 is a circuit of another conventional loop filter. As shown in the drawing, the loop filter 30 includes a charge/discharge path constituted by a resistor R2 and a capacitor C2, and further includes a second resistor R3 and an OP amplifier 34. If the offset between the + input terminal and − input terminal of the OP amplifier 34 is ignored, the voltage of the output terminal of the OP amplifier 34 equals to the voltage of the input terminal. Therefore, the voltage of R2*I2 should be equal to the voltage of R3*I3. Consequently, as long as the ratio of the resistance of the resistor R2 to that of the resistor R3 is properly adjusted, the current flowing into the capacitor C2 may be reduced, and the capacitance of the capacitor C2 may be reduced accordingly. For example, if R2:R3 is 9:1, then I2=⅒*Icp, so the capacitance of the capacitor C2 also may be reduced to one-tenth of that of the capacitor C1 in the FIG. 2. However, the actual voltages at the two input terminals of the OP amplifier of the loop filter 30 are not completely the same, thereby causing a voltage difference between the first input terminal (e.g., + input terminal) and the output terminal and causing a loop current Isw accordingly. The loop current Isw may cause the voltage of the capacitor C2 to be changed and make the control voltage Vctl unstable. In addition, in order to make the loop filter 30 of FIG. 3 equivalent to the loop filter 20 of FIG. 2, the resistance of the parallel resistors R2 and R3 has to equal to that of resistor R1. Consequently, if R2:R3 is 9:1, the resistance of the resistor R2 is about ten times of that of the resistor R1. Too large resistance may cause difficulty in design.

SUMMARY OF THE INVENTION

In view of the above-mentioned problems, it is therefore an object of the invention to provide a loop filter capable of reducing a loop current of an OP amplifier in the loop filter so as to enhance the stability of an output voltage.

Another object of the invention is to provide a method for adjusting a compensating current of a loop filter so as to enhance the stability of an output voltage of the loop filter.

To achieve the above-mentioned objects, the loop filter of the invention, includes a first resistor, a capacitor, a second resistor, a compensating unit, an OP amplifier, and a current source. The first resistor has a first terminal for receiving a control current. The capacitor is connected to a second terminal of the first resistor. The second resistor has a first terminal connected to the first terminal of the first resistor. The compensating unit generates a compensating voltage and has a first terminal connected to a second terminal of the second resistor. The OP amplifier has an output terminal connected to the second terminal of the second resistor, a first input terminal connected to the second terminal of the first resistor, and a second input terminal connected to a second terminal of the compensating unit. The current source provides a compensating current and is connected to the second terminal of the compensating unit.

The loop filter utilizes the compensating unit to compensate the offset between the two input terminals of the amplifier. Therefore, the loop current of the OP amplifier can be reduced or eliminated and the control voltage is stable.

DETAILED DESCRIPTION OF THE INVENTION

The loop filter and method for adjusting the compensating current of the OP amplifier of the present invention will be described with reference to the accompanying drawings.

The loop filter of the invention utilizes a compensating unit to provide a reversed voltage to balance the offset Vos of the two input terminals of the OP amplifier. Thus, the voltage of the output terminal of the OP amplifier may be substantially equal to the voltage (capacitor's voltage) of the first input terminal so that the loop current of the OP amplifier may be reduced or eliminated, and the stability of the output voltage may be enhanced accordingly.

Figure 1:
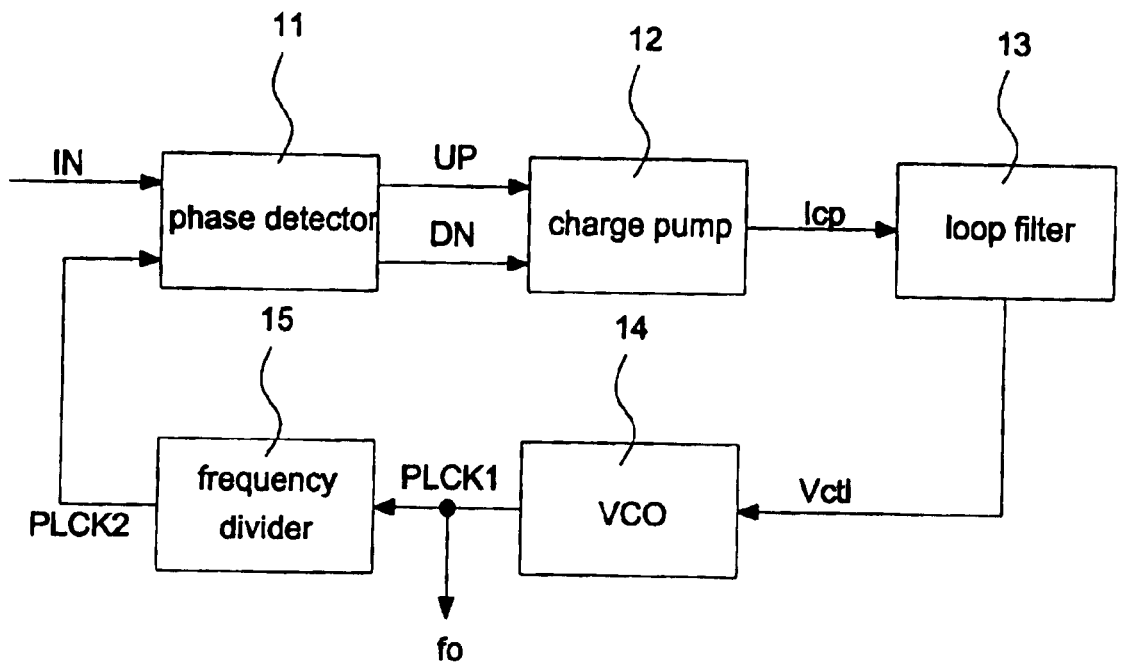
FIG. 1 is a block diagram of a digital phase locked loop.
Figure 2:
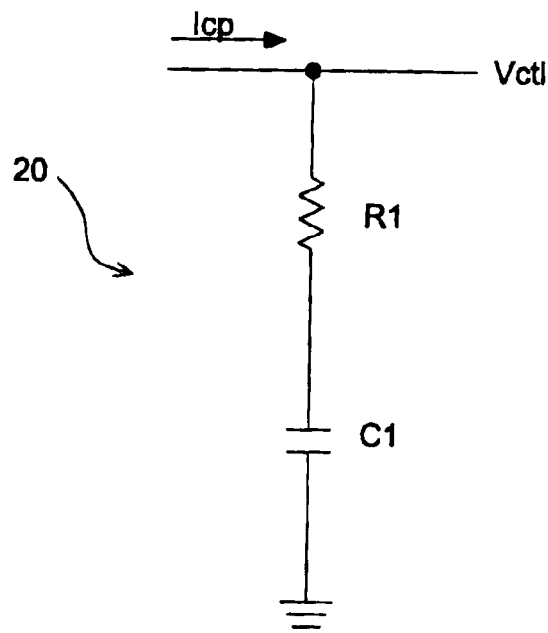
FIG. 2 is a circuit of a conventional loop filter.
Figure 3:
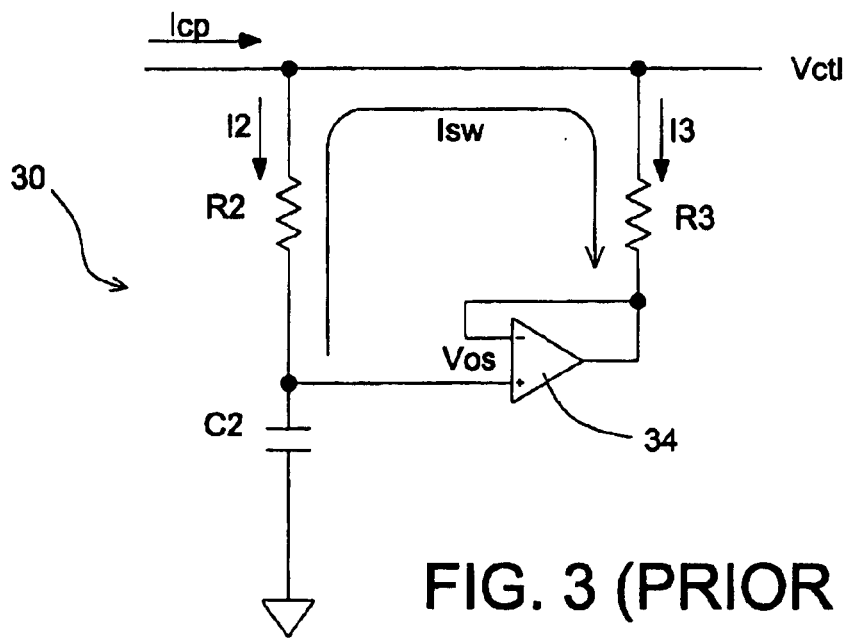
FIG. 3 is a circuit of another conventional loop filter.
Figure 4:
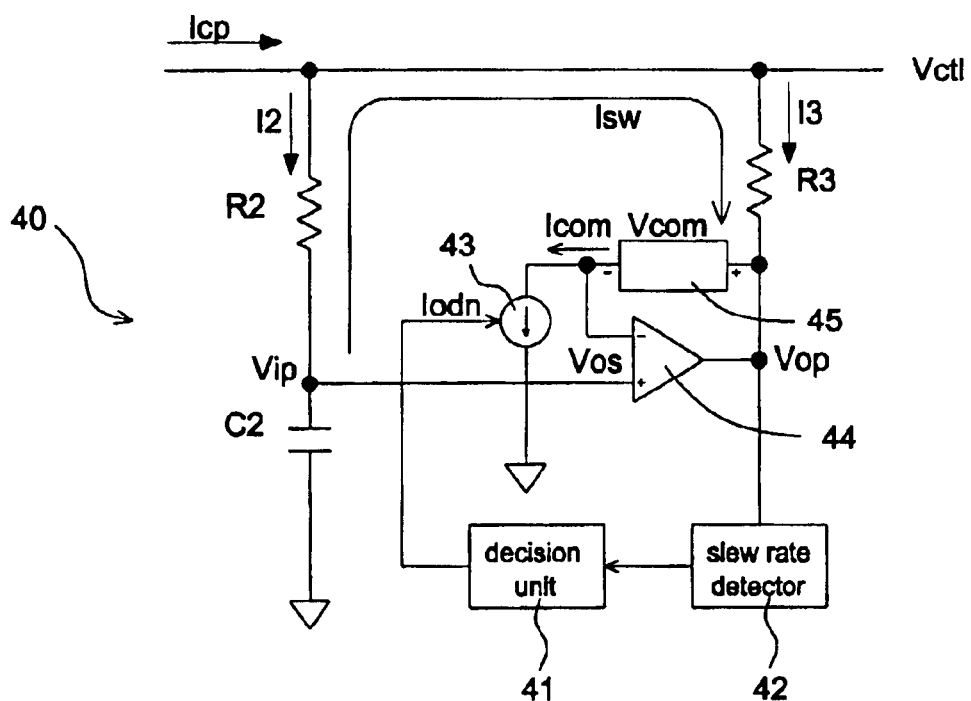
FIG. 4 is a circuit of a loop filter according to a first embodiment of the invention.

FIG. 4 is a circuit of a loop filter according to a first embodiment of the present invention. Referring to FIG. 4, the loop filter 40 of the present invention includes a charge/discharge path constituted by a first resistor R2 and a capacitor C2, a second resistor R3, a compensating unit 45, an OP amplifier 44, a current source 43, a decision unit 41, and a slew rate detector 42. The first resistor R2, the capacitor C2, the second resistor R3 and the OP amplifier 44 have the same functions as the corresponding elements in FIG. 3, and detailed description thereof will be omitted. In this embodiment, the first input terminal (positive input terminal) of the OP amplifier 44 is connected to the capacitor C2, and the second input terminal (negative input terminal) is connected to the compensating unit 45.

Since the offset Vos still exists between two input terminals of the OP amplifier 44 to cause the loop current Isw, the present invention utilizes the compensating unit 45 to generate a reversed compensating voltage Vcom to reduce the voltage difference between the voltage Vop of the output terminal of the OP amplifier 44 and the voltage Vip of the capacitor C2, in order to reduce the loop current Isw. The compensating unit 45 may be a resistor, or other elements. In addition, the current source 43 is utilized to provide a compensating current Icom to cause a reversed compensating voltage Vcom. In this embodiment, the compensating current Icom flows from the compensating unit 45 into the current source 43. Therefore, as long as a proper compensating current Icom is provided, it is possible to make the reversed compensating voltage Vcom equal to the offset Vos of the OP amplifier 44, thereby reducing or eliminating the loop current Isw.

The method for obtaining the compensating current Icom will be described hereinbelow. The voltage Vop of the output terminal of the OP amplifier 44 may be represented by Equation (1), wherein Roff denotes the resistance value of the compensating unit 45:

$$Vop=Vip-Vos+Icom*Roff \quad (1).$$

Thus, in order to make the voltage Vop equal to the voltage Vip, the compensating current Icom should be represented by Equation (2):

$$Icom=Vos/Roff \quad (2).$$

However, since the offsets Vos of the OP amplifiers have different magnitudes under different manufacturing processes or operation voltages, the decision unit 41 and the voltage slew rate detector 42 are utilized to generate the proper compensating current Icom. That is, after the phase-locked state, the voltage slew rate detector 42 is first utilized to detect a voltage slew rate of the voltage Vop at the output terminal of the OP amplifier 44. Then, the decision unit 41 generates a control signal to adjust the magnitude of the compensating current Icom of the current source 43 according to the magnitude of the voltage slew rate.

Figure 5:
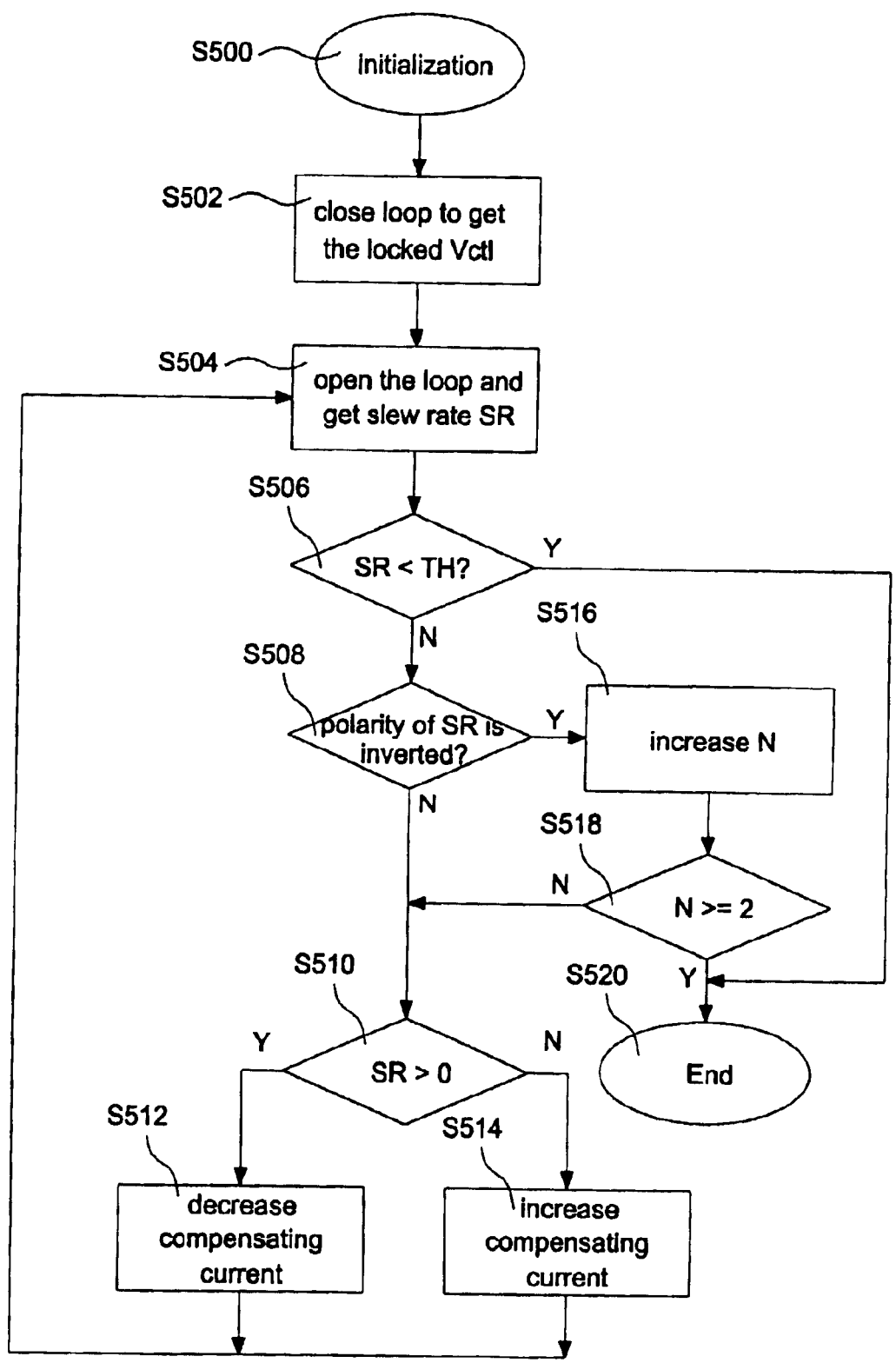
FIG. 5 shows a flow chart of a method for generating a compensating current of the loop filter according to the first embodiment of the invention.

FIG. 5 shows a flow chart of a method for adjusting the compensating current. The flow chart is utilized to generate the compensating current Icom of the loop filter of FIG. 4. The method includes the following steps.

Step S500: initialization.

Step S502: close the loop and get the locked control voltage Vctl. The PLL's loop is first closed and the PLL operation is enabled until the locked state so as to generate the required control voltage Vctl.

Step S504: open the loop of the PLL and get the voltage slew rate. The PLL's loop is opened (i.e., the chare pump current is not provided to the loop filter) and the voltage slew rate detector detects the slew rate SR and its slew rate polarity of the control voltage Vctl.

Step S506: compare the absolute value of the voltage slew rate SR with a voltage threshold value. If the absolute value of the voltage slew rate SR is smaller than the slew rate threshold value, the best compensating current Icom has been generated, and the process jumps to step S520. Otherwise, the process jumps to step S508.

Step S508: determine whether the polarity of the voltage slew rate SR is reversed. If yes, the process jumps to step S516. Otherwise, the process jumps to step S510.

Step S510: if the voltage slew rate SR is greater than 0, it means that the positive compensating voltage is too great and the process jumps to step S512. Otherwise, jump to step S514.

Step S512: decrease the compensating current, and jump back to step S504.

Step S514: increase the compensating current and the jump back to step S504.

Step S516: increase the polarity converting times N.

Step S518: if the polarity converting times N is greater than 2, jump to step S520. Otherwise, jump back to step S504.

Step S520: end.

Of course, in the above-mentioned steps, since the resolution of decreasing or increasing the compensating current is limited, the voltage slew rate SR may not be exactly adjusted to 0. Consequently, if the polarity converting times N in step S518 is greater than or equal to 2, it means that the optimum compensating current has been found. Of course, in step S520, it is also possible to further choose the compensating current of a smaller voltage slew rate SR during two polarity converting processes as the finally decided compensating current.

Figure 6:
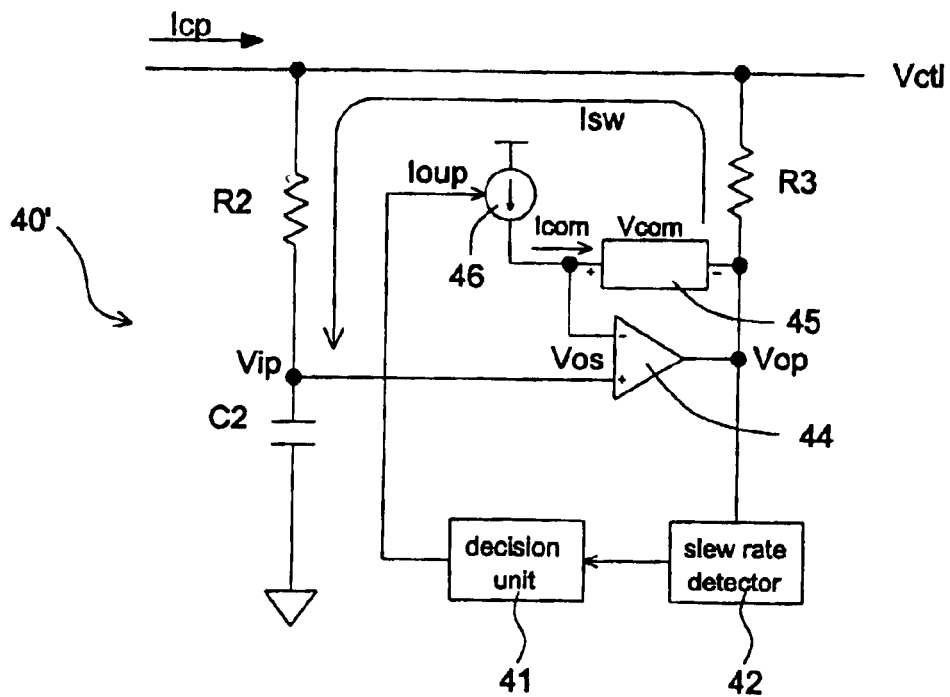
FIG. 6 is a circuit of a loop filter according to a second embodiment of the invention.

FIG. 6 is a circuit of a loop filter according to a second embodiment of the invention. Referring to FIG. 6, the loop filter 40' of the embodiment includes a charge/discharge path constituted by a first resistor R2 and a capacitor C2, a second resistor R3, a compensating unit 45, an OP amplifier 44, a current source 46, a decision unit 41, and a voltage slew rate detector 42. The functions of the first resistor R2, the capacitor C2, the second resistor R3 and the OP amplifier 44 are the same as those of corresponding elements in FIG. 3, and detailed description thereof will be omitted. In this embodiment, a first input terminal (positive input terminal) of the OP amplifier 44 is connected to the capacitor C2, and the second input terminal (negative input terminal) of the OP amplifier 44 is connected to the compensating unit 45.

Since a offset voltage Vos still exists between two input terminals of the OP amplifier 44 to cause the loop current Isw, the present invention utilizes the compensating unit 45 to generate a reversed compensating voltage Vcom, which may reduce the voltage difference between the voltage Vop of the output terminal of the OP amplifier 44 and the voltage Vip of the capacitor C2, in order to reduce the loop current Isw. The compensating unit 45 may be a resistor, or other elements with the same function. In addition, the current source 46 is utilized to provide a compensating current Icom to cause a reversed compensating voltage Vcom. In this embodiment, the compensating current Icom flows from the current source 46 to the compensating unit 45. Therefore, as long as a proper compensating current Icom is provided, it is possible to make the reversed compensating voltage Vcom equal to the offset voltage Vos of the OP amplifier 44, thereby reducing or eliminating the loop current Isw. The magnitude of the compensating current Icom of the current source 43 is generated by the decision unit 41 and the voltage slew rate detector 42.

Figure 7:
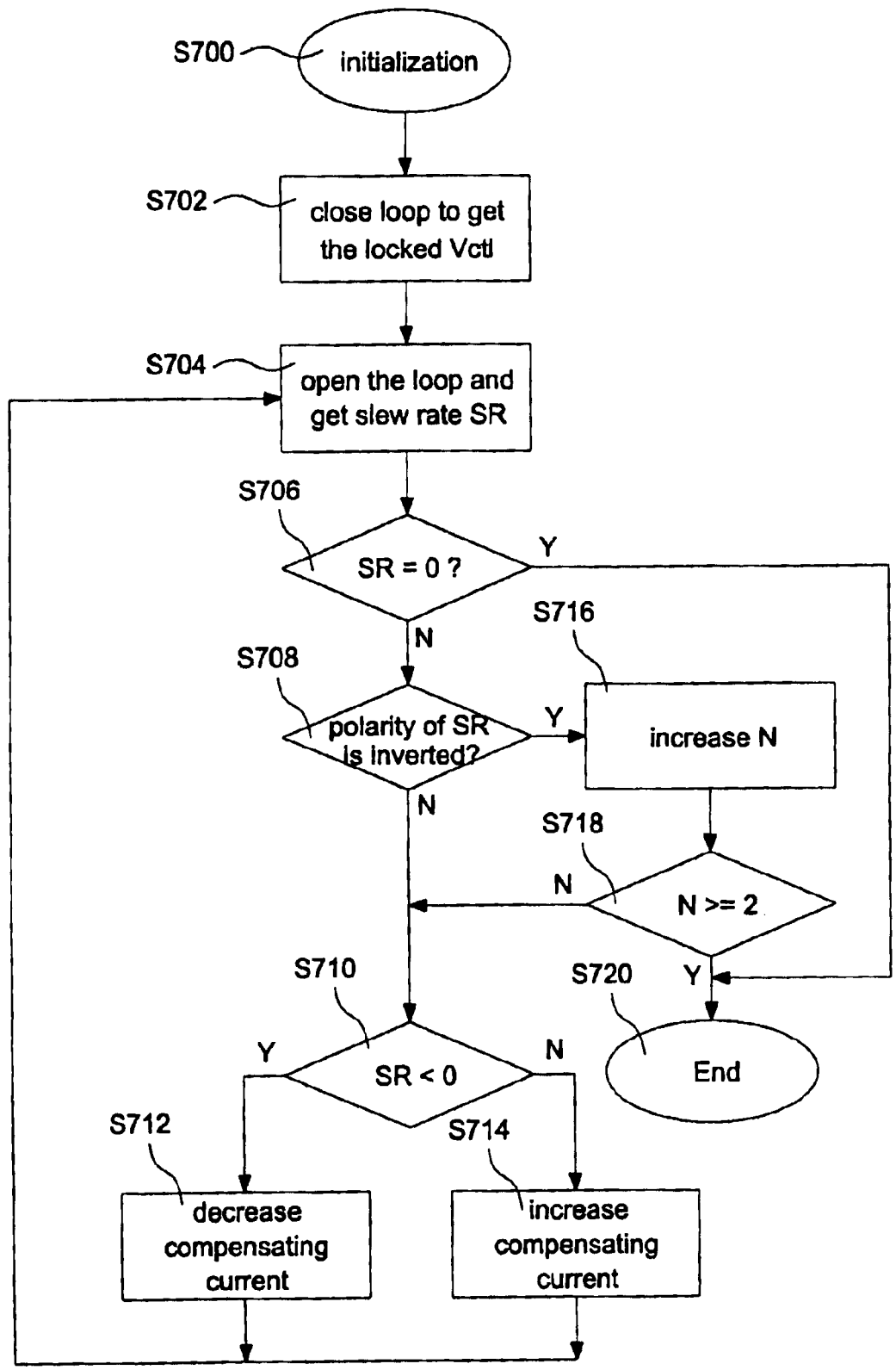
FIG. 7 shows a flow chart of a method for generating a compensating current of a loop filter according to the second embodiment of the invention.

FIG. 7 shows a flow chart of a method for generating a compensating current. The flow chart is utilized to generate the compensating current Icom of the loop filter of FIG. 6. The method includes the following steps.

Step S700: initialization.

Step S702: close the loop and get the locked control voltage Vctl. The PLL's loop is first closed and the PLL operation is enabled until the locked state so as to generate the required control voltage Vctl.

Step S704: open the loop of the PLL and get the voltage slew rate. The PLL's loop is opened (i.e., the control current is not provided to the loop filter) and the voltage slew rate detector detects the slew rate SR of the control voltage Vctl.

Step S706: compare the absolute value of the voltage slew rate SR with a voltage threshold value. If the absolute value of the voltage slew rate SR is smaller than the voltage threshold value, the best compensating current Icom has been generated, and the process jumps to step S720. Otherwise, the process jumps to step S708.

Step S708: determine whether the polarity of the voltage slew rate SR is reversed. If yes, the process jumps to step S716. Otherwise, the process jumps to step S710.

Step S710: if the voltage slew rate SR is smaller than 0, it means that the compensating current is too great and the process jumps to step S712. Otherwise, jump to step S714.

Step S712: decrease the compensating current, and jump back to step S704.

Step S714: increase the compensating current and the jump back to step S704.

Step S716: increase the polarity converting times N.

Step S718: if the polarity converting times N is greater than 2, jump to step S720. Otherwise, jump back to step S704.

Step S720: end.

Of course, in the above-mentioned steps, since the resolution of decreasing or increasing the compensating current is limited, the voltage slew rate SR may not be exactly adjusted to 0. Consequently, if the polarity converting times N in step S518 is greater than or equal to 2, it means that the optimum compensating current has been found. Of course, in step S720, it is also possible to further choose the compensating current of a smaller voltage slew rate SR during two polarity converting processes as the finally decided compensating current.

Figure 8:
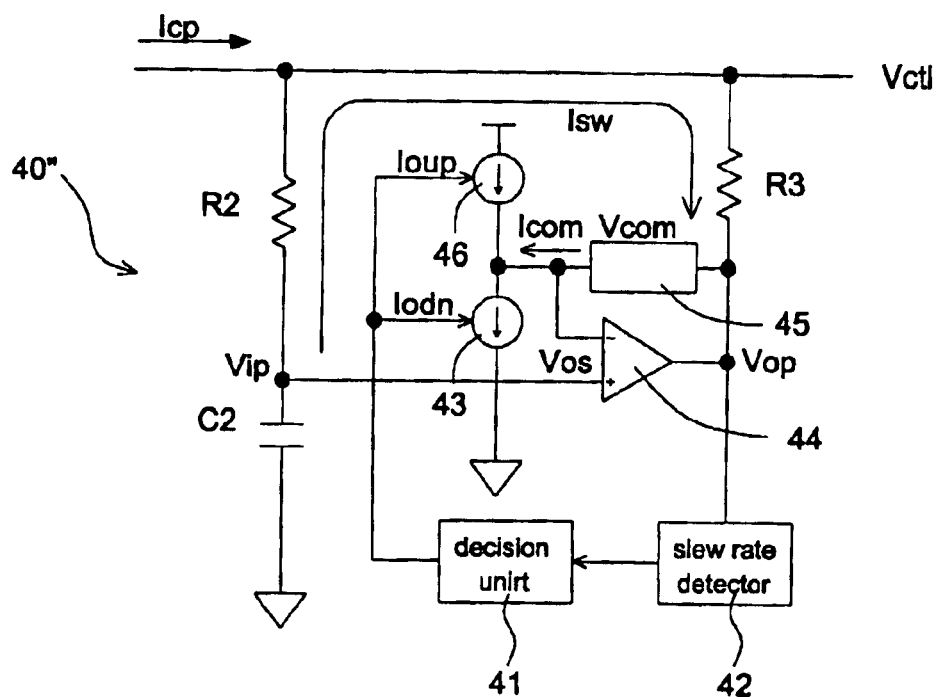
FIG. 8 is a circuit of a loop filter according to a third embodiment of the invention.

FIG. 8 is a circuit of a loop filter according to a third embodiment of the present invention. Referring to FIG. 8, the loop filter 40″ of this embodiment includes a charge/discharge path constituted by a first resistor R2 and a capacitor C2, a second resistor R3, a compensating unit 45, an OP amplifier 44, a first current source 43, a second current source 46, a decision unit 41, and a voltage slew rate detector 42. The functions of the first resistor R2, the capacitor C2, the second resistor R3 and the OP amplifier 44 are the same as those of corresponding elements in FIG. 3, and detailed description thereof will be omitted. In this embodiment, a first input terminal of the OP amplifier 44 is connected to the capacitor C2 and a second input terminal of the OP amplifier 44 is connected to the compensating unit 45.

Since an offset Vos still exists between two input terminals of the OP amplifier 44 to cause the loop current Isw, the invention utilizes the compensating unit 45 to generate a reversed compensating voltage Vcom, which may reduce the voltage difference between the voltage Vop of the output terminal of the OP amplifier 44 and the voltage Vip of the capacitor C2, in order to reduce the loop current Isw. The compensating unit 45 may be a resistor. In addition, the current sources 43 and 46 are utilized to provide a compensating current Icom to cause a reversed compensating voltage Vcom. In this embodiment, the compensating current Icom may flow into or out of the compensating unit 45 according to the polarity of the first input terminal. Therefore, as long as a proper compensating current Icom is provided, it is possible to make the reversed compensating voltage Vcom equal to the offset voltage Vos of the OP amplifier 44, thereby reducing or eliminating the loop current Isw. The magnitude of the compensating current Icom of each of the current sources 43 and 46 is generated by the decision unit 41 and the voltage slew rate detector 42.

Figure 9:
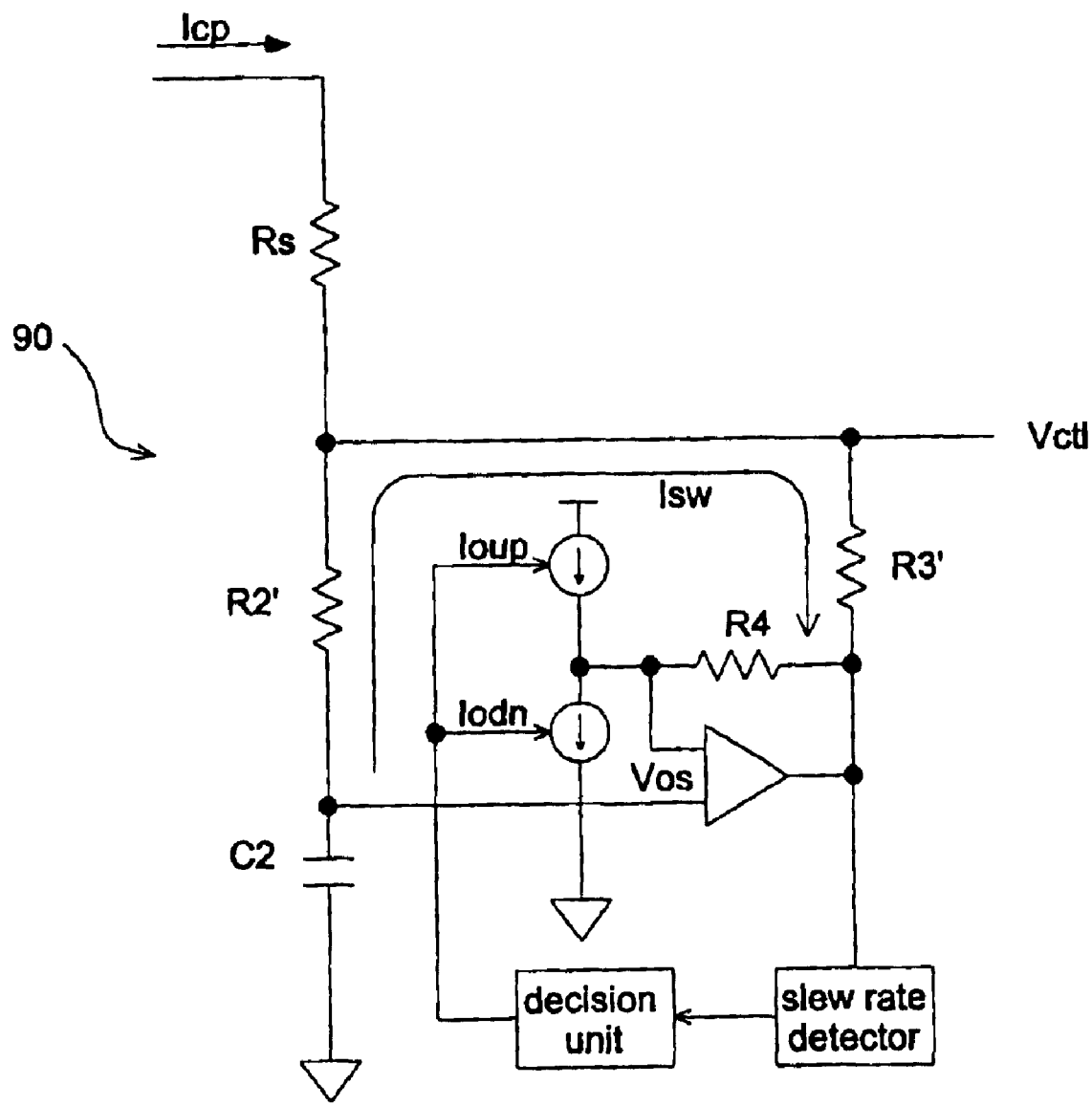
FIG. 9 is a circuit of a loop filter according to a fourth embodiment of the invention.

FIG. 9 is a circuit of a loop filter according to a fourth embodiment of the present invention. As shown in FIG. 9, the loop filter 90 of this embodiment is substantially the same as the loop filter 40″ of the third embodiment of FIG. 8 except that the control current Icp of this embodiment flows through a fourth resistor Rs and then to the first resistor R2' and the second resistor R3'. The fourth resistor Rs functions to reduce the magnitude of the resistance of each of the first resistor R2' and the second resistor R3'. That is, $$Rs+R2'\|R3'=R2\|R3 \qquad (3).$$

Of course, the fourth resistor Rs also may be applied to the loop filter 40 and 40' of the first and second embodiments.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A loop filter for receiving a control current and generating a control voltage, the loop filter comprising:

a first resistor having a first terminal and a second terminal, the first terminal receiving the control current;

a capacitor connected to the second terminal of the first resistor;

a second resistor having a first terminal and a second terminal, the first terminal being connected to the first terminal of the first resistor;

a compensating unit for generating a compensating voltage and having a first terminal and a second terminal, the first terminal being connected to the second terminal of the second resistor;

an OP amplifier having an output terminal connected to the second terminal of the second resistor, a first input terminal connected to the second terminal of the first resistor, and a second input terminal connected to the second terminal of the compensating unit; and a current source connected to the second terminal of the compensating unit to provide a compensating current to the compensating unit;

wherein the voltage of the output terminal of the OP amplifier substantially equal to that of the first input terminal of the OP amplifier.

2. The loop filter according to claim 1, further comprising:

a voltage slew rate detector for detecting a voltage slew rate of the output terminal of the OP amplifier; and a deciding unit for controlling the value of the compensating current of the current source according to the voltage slew rate.

3. The loop filter according to claim 1, wherein the compensating unit is a resistor.

4. The loop filter according to claim 1, further comprising a fourth resistor, wherein the control current flows first through the fourth resistor such that the resistances of the first resistor and the second resistor is reduced.

5. The loop filter according to claim 1, wherein the first input terminal of the OP amplifier is a positive terminal, and the second input terminal of the OP amplifier is a negative terminal.

6. The loop filter according to claim 5, wherein the current of the current source flows out of the second terminal of the compensating unit.

7. The loop filter according to claim 5, wherein the current of the current source flows into the second terminal of the compensating unit.

8. The loop filter according to claim 1, wherein the loop filter is used in a phase locked loop.

9. A method for adjusting a compensating current of a loop filter in a phase locked loop to make a control voltage stable, the loop filter having a charge/discharge path, a resistor, an OP amplifier connected to the charge/discharge path and the resistor for outputting the control voltage, a compensating unit connected to an output and a second input terminals of the OP amplifier, and a current source connected to the compensating unit for providing a compensating current, the charge/discharge path and the resistor receiving a control current, the method comprising the steps of:

closing the loop of the phase locked loop and obtaining the control voltage;

opening the loop of the phase locked loop;

measuring a slew rate of the control voltage;

completing the adjustment if an absolute value of the slew rate is smaller than a voltage threshold;

reducing the compensating current and repeating the steps when the slew rate is greaten than 0 and the second input terminal of the OP amplifier is a negative terminal, or the slew rate is smaller than 0 and the second input terminal of the OP amplifier is a positive terminal; and increasing the compensating current and repeating the steps when the slew rate is smaller than 0 and the second input terminal of the OP amplifier is a negative terminal, or the slew rate is greater than 0 and the second input terminal of the OP amplifier is a positive terminal.

* * * * *